United States Patent
Seo et al.

(10) Patent No.: US 11,758,652 B2
(45) Date of Patent: Sep. 12, 2023

(54) PRINTED CIRCUIT BOARD AND SEMICONDUCTOR MODULE INCLUDING THE SAME

(71) Applicant: SAMSUNG ELECTRONICS CO., LTD., Suwon-si (KR)

(72) Inventors: Dongyoon Seo, Seoul (KR); Geunje Park, Hwaseong-si (KR); Dohyung Kim, Seoul (KR); Hwanwook Park, Suwon-si (KR); Dongmin Jang, Hwaseong-si (KR); Jaeseok Jang, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/360,417

(22) Filed: Jun. 28, 2021

(65) Prior Publication Data

US 2022/0159832 A1    May 19, 2022

(30) Foreign Application Priority Data

Nov. 17, 2020  (KR) ........................ 10-2020-0153621

(51) Int. Cl.
   *H05K 1/11* (2006.01)
   *H05K 1/18* (2006.01)
(52) U.S. Cl.
   CPC ............. *H05K 1/111* (2013.01); *H05K 1/181* (2013.01); *H05K 2201/09745* (2013.01)
(58) Field of Classification Search
   CPC ................... H05K 1/111; H05K 1/181; H05K 2201/09745; H05K 3/303; H05K 2201/09381; H05K 2201/09427; H05K 2203/048; H05K 3/3494; H05K 2201/10022; H01L 23/12
   See application file for complete search history.

(56) References Cited

U.S. PATENT DOCUMENTS

| | | | |
|---|---|---|---|
| 6,443,351 | B1 | 9/2002 | Huang et al. |
| 6,624,512 | B2 | 9/2003 | Kurusu |
| 7,732,919 | B2 * | 6/2010 | Shimizu .................. H01L 24/40 257/532 |
| 8,237,273 | B2 | 8/2012 | Hsu et al. |
| 2008/0251945 | A1 | 10/2008 | Chen et al. |

(Continued)

FOREIGN PATENT DOCUMENTS

JP    19940268016    9/1994

*Primary Examiner* — Ishwarbhai B Patel
(74) *Attorney, Agent, or Firm* — F. Chau & Associates, LLC (57) ABSTRACT

A printed circuit board (PCB) includes: an insulation substrate; a first pad on the insulation substrate; and a second pad on the insulation substrate and spaced apart from the first pad, wherein the second pad has a size substantially the same as a size of the first pad, wherein the first pad includes a first recess configured to receive a first electrode of a passive element, wherein the second pad includes a second recess receiving a second electrode of the passive element, wherein the first recess has a depth substantially the same as a thickness of the first pad, wherein the second recess has a depth substantially the same as a thickness of the second pad, wherein each of the first recess and the second recess exposes an upper surface of the insulation substrate.

20 Claims, 8 Drawing Sheets

(56) References Cited

U.S. PATENT DOCUMENTS

| | | | |
|---|---|---|---|
| 2013/0335933 A1* | 12/2013 | Ishii | H05K 1/111 |
| | | | 361/752 |
| 2018/0020547 A1* | 1/2018 | Chan | H05K 3/0005 |
| 2018/0027659 A1* | 1/2018 | Huber | H01L 25/50 |
| | | | 361/761 |

* cited by examiner

SECOND DIRECTION

FIRST DIRECTION

PRINTED CIRCUIT BOARD AND SEMICONDUCTOR MODULE INCLUDING THE SAME

CROSS-REFERENCE TO RELATED APPLICATION

This application claims priority under 35 USC § 119 to Korean Patent Application No, 10-2020-0153621, filed on Nov. 17, 2020 in the Korean Intellectual Property Office (KIPO), the disclosure of which is incorporated by reference herein in its entirety.

TECHNICAL FIELD

Exemplary embodiments of the present inventive concept relate to a printed circuit board and a semiconductor module including the same. More particularly, exemplary embodiments of the present inventive concept relate to a printed circuit board configured to receive a passive element, and a semiconductor module including the printed circuit board.

DISCUSSION OF THE RELATED ART

Generally, a semiconductor module may include a printed circuit board (PCB), a pair of pads arranged on the PCB, and a passive element. Typically, the passive element may be mounted on the pads.

Further, the passive element on the pads may be typically bonded to the pads by a reflow process using a solder. Thus, an adhesive force between the passive element and the pads may be relatively weak.

SUMMARY

According to an exemplary embodiment of the present inventive concept, a printed circuit board (PCB) includes: an insulation substrate; a first pad arranged on the insulation substrate; and a second pad arranged on the insulation substrate and spaced apart from the first pad along a first direction, wherein the second pad has a size substantially the same as a size of the first pad, wherein the first pad includes a first recess having a rectangular shape configured to receive a first electrode of a passive element, wherein the second pad includes a second recess receiving a second electrode of the passive element, wherein the first recess has a depth substantially the same as a thickness of the first pad, wherein the second recess has a depth substantially the same as a thickness of the second pad, wherein each of the first recess and the second recess exposes an upper surface of the insulation substrate, wherein each of the first and second recesses has a first length along the first direction of about 0.29 times to about 0.86 times a first length of the first pad along the first direction, and wherein each of the first and second recesses has a second length along a second direction, which is substantially perpendicular to the first direction, of about 0.4 times to about 0.8 times a second length of the first pad along the second direction.

According to an exemplary embodiment of the present inventive concept, a printed circuit board (PCB) includes: an insulation substrate; a first pad arranged on an upper surface of the insulation substrate; and a second pad arranged on the upper surface of the insulation substrate and spaced apart from the first pad along a first direction, wherein the first pad includes a first recess configured to receive a first electrode of a passive element, wherein the second pad includes a second recess configured to receive a second electrode of the passive element, wherein the first recess has a depth substantially the same as a thickness of the first pad, wherein the second recess has a depth substantially the same as a thickness of the second pad, and wherein each of the first recess and the second recess exposes the upper surface of the insulation substrate.

According to an exemplary embodiment of the present inventive concept, a semiconductor module includes: a printed circuit board (PCB) including: an insulation substrate; a first pad arranged on an upper surface of the insulation substrate, wherein the first pad includes a first recess configured to expose the upper surface of the insulation substrate; and a second pad arranged on the upper surface of the insulation substrate and spaced apart from the first pad along a first direction, wherein the second pad includes a second recess configured to expose the upper surface of the insulation substrate. The semiconductor module further includes: a passive element mounted on the first pad and the second pad, wherein the passive element is inserted into the first and second recesses; and a solder layer formed on the first and second pads to at least partially surround side surfaces of the passive element.

BRIEF DESCRIPTION OF THE DRAWINGS

The above and other features of the present inventive concept will become more apparent by describing in detail exemplary embodiments thereof, with reference to the accompanying drawings, in which.

DETAILED DESCRIPTION OF THE EMBODIMENTS

Hereinafter, exemplary embodiments of the present inventive concept will be described in detail with reference to the accompanying drawings.

Figure 1:
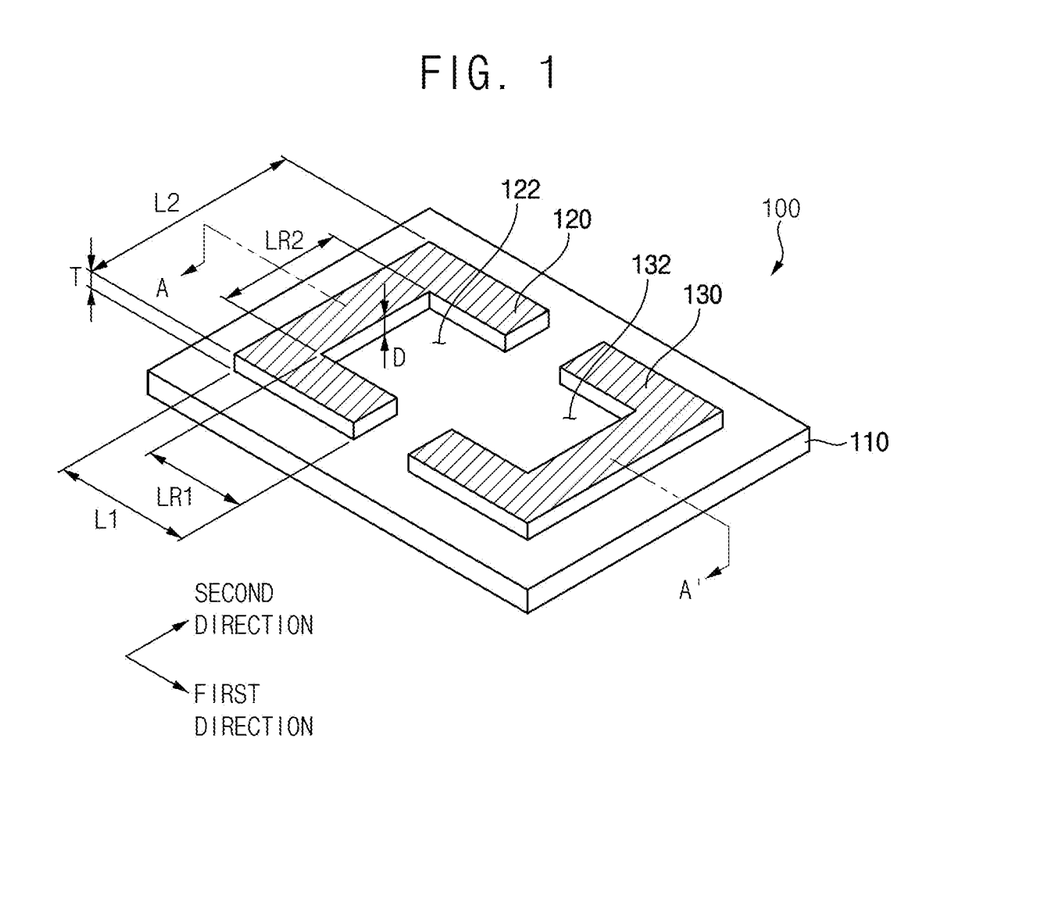
FIG. 1 is a perspective view illustrating a printed circuit board (PCB) in accordance with an exemplary embodiment of the present inventive concept.
Figure 2:
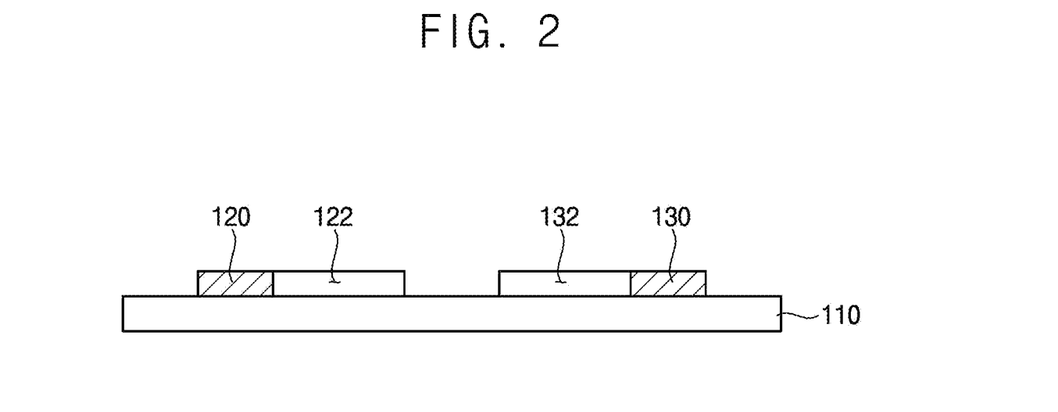
FIG. 2 is a cross-sectional view taken along a line A-A' in FIG. 1.

FIG. 1 is a perspective view illustrating a printed circuit board (PCB) in accordance with an exemplary embodiment of the present inventive concept, and FIG. 2 is a cross-sectional view taken along a line A-N in FIG. 1.

Referring to FIGS. 1 and 2, according to an exemplary embodiment of the present inventive concept, a printed circuit board (PCB) 100 may include an insulation substrate 110, a first pad 120 and a second pad 130.

The insulation substrate 110 may include a plurality of insulation layers and a plurality of reference layers. For example, the reference layers may be interposed between the insulation layers. The reference layers may be electrically connected with each other through via contacts formed in the insulation layers.

The first pad 120 may be arranged on the insulation substrate 110. For example, the first pad 120 may be arranged on an upper surface of the insulation substrate 110. The first pad 120 may include, for example, copper, but the present inventive concept is not limited thereto. For example, the first pad 120 may have a polygonal shape. For example, the first pad 120 may have a rectangular parallelepiped shape, but the present inventive concept is not limited thereto. Thus, the first pad 120 may have a first length L1 along a first direction, a second length L2 along a second direction substantially perpendicular to the first direction, and a thickness T. In an exemplary embodiment of the present inventive concept, the first length L1 of the first pad 120 may be about 0.35 mm, the second length L2 of the first pad 120 may be about 0.5 mm, and the thickness T of the first pad 120 may be about 0.04 mm.

In an exemplary embodiment of the present inventive concept, the first pad 120 may include a first part that extends in the first direction, a second part connected to the first part and extending in the second direction, and a third part connected to the second part and extending in the first direction.

The first pad 120 may electrically make contact with a passive element. The passive element may include a chip register. The chip register may include a single series resistance connected between the first pad 120 and the second pad 130. The first pad 120 may include a first recess 122. For example, the first recess 122 may be formed at a central portion of an inner surface of the first pad 120 toward the second pad 130, e.g., a right side surface of the first pad 120 in FIG. 1. A first electrode of the passive element may be inserted into the first recess 122. For example, the first recess 122 may be configured to receive the first electrode of the passive element. For example, the first electrode of the passive element may closely make contact with inner surfaces of the first recess 122. In addition, a gap may be formed between the first electrode of the passive element and the inner surfaces of the first recess 122.

The passive element may have a polygonal shape. For example, the passive element may have a rectangular parallelepiped shape. Thus, the first electrode of the passive element may also have a rectangular parallelepiped shape. Because the rectangular first electrode of the passive element may be inserted into the first recess 122, the first recess 122 may also have a rectangular cross-sectional shape. The shape of the first recess 122 may be changed in accordance with the shape of the first electrode of the passive element. Therefore, the shape of the first recess 122 may not be restricted to a specific shape.

For example, the first recess 122 may have a depth D substantially the same as the thickness T of the first pad 120. For example, the first recess 122 may be formed by completely removing an inner portion of the first pad 120 in a vertical direction. Thus, the upper surface of the insulation substrate 110 may be exposed through the first recess 122.

When the first recess 122 may have the rectangular cross-sectional shape, the first recess 122 may have a first length LR1 along the first direction of about 0.29 times to about 0.86 times the first length L1 of the first pad 120. For example, when the first length L1 of the first pad 120 may be about 0.35 mm, the first length LR1 of the first recess 122 may be about 0.1 mm to about 0.3 mm. Further, the first recess 122 may have a second length LR2 along the second direction of about 0.4 times to about 0.8 times the second length L2 of the first pad 120. For example, when the second length L2 of the first pad 120 may be about 0.5 mm, the second length LR2 of the first recess 122 may be about 0.2 mm to about 0.4 mm.

The second pad 130 may be arranged on the insulation substrate 110. For example, the second pad 130 may be disposed on the upper surface of the insulation substrate 110. The second pad 130 may be spaced apart from the first pad 120 along the first direction. In an exemplary embodiment of the present inventive concept, a distance between the first pad 120 and the second pad 130 may be about 0.2 mm, the present inventive concept is not limited thereto. The second pad 130 may have a shape and a size substantially the same as the shape and the size of the first pad 120. Thus, any further illustrations with respect to the second pad 130 having the rectangular parallelepiped shape may be omitted herein for brevity.

The second pad 130 may electrically make contact with a passive element. For example, the first pad 120 and the second pad 130 may be electrically connected with each other via the passive element. The second pad 130 may include a second recess 132. For example, the second recess 132 may be formed at a central portion of an inner surface of the second pad 120 toward the first pad 120, e.g., a left side surface of the second pad 130 in FIG. 1. A second electrode of the passive element may be inserted into the second recess 132. For example, the second recess 132 may be configured to receive the second electrode of the passive element. For example, the second recess 132 may have a depth 1) substantially the same as the thickness T of the second pad 130. Thus, the upper surface of the insulation substrate 110 may be exposed through the second recess 132.

The second recess 132 may have a shape and a size substantially the same as the shape and the size of the first recess 122. Thus, any further illustrations with respect to the second recess 132 may be omitted herein for brevity.

Figure 3:
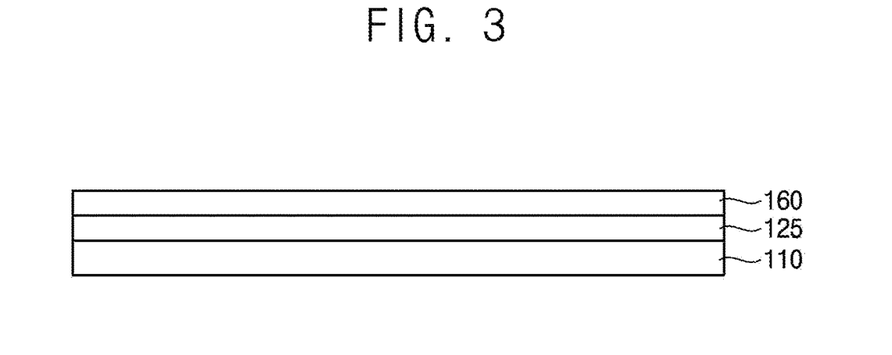
FIGS. 3, 4 and 5 are a plan view and cross-sectional views illustrating a method of manufacturing the PCB in FIG. 1.
Figure 4:
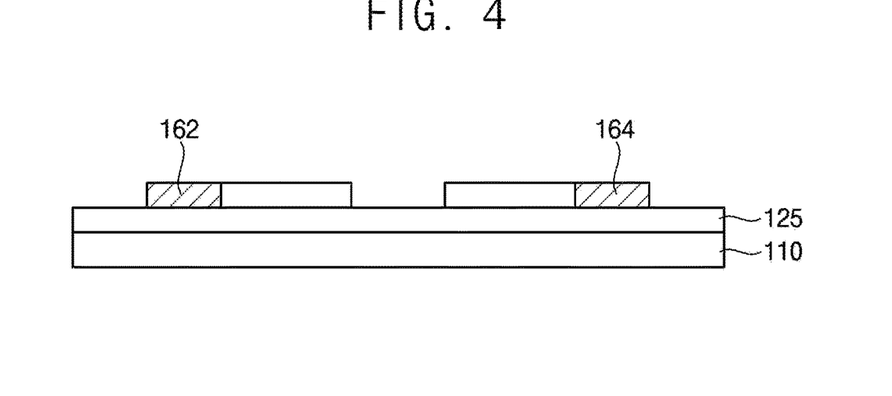
Figure 5:
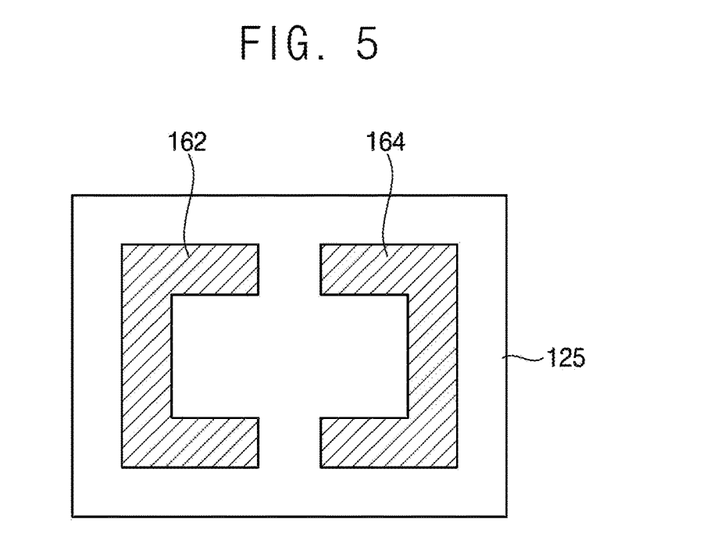

FIGS. 3 to 5 are a plan view and cross-sectional views illustrating a method of manufacturing the PCB in FIG. 1.

Referring to FIG. 3, a conductive layer 125 including, for example, copper may be formed on the upper surface of the insulation substrate 110. A mask film 160 may be formed on an upper surface of the conductive layer 125. The mask film 160 may include a dry film.

Referring to FIG. 4, an exposing process may be performed on the mask film 160 to form mask patterns 162 and 164.

As shown in FIG. 5, the mask patterns 162 and 164 may be configured to cover the first pad 120 and the second pad 130. For example, the mask patterns 162 and 164 may be used to form the first pad 120 and the second pad 130 in the conductive layer 125.

The conductive layer 125 may be etched using the mask patterns 162 and 164 as an etch mask to form the first pad 120, having the first recess 122, and the second pad 130, having the second recess 132. The mask patterns 162 and 164 may then be removed to form the PCB 100 in FIG. 1.

In an exemplary embodiment of the present inventive concept, the first pad 120 and the second pad 130 may be formed on the upper surface of the insulation substrate 110. In addition, the first pad 120 and the second pad 130 may be formed on a lower surface of the insulation substrate 110 by the above-mentioned processes.

Figure 6:
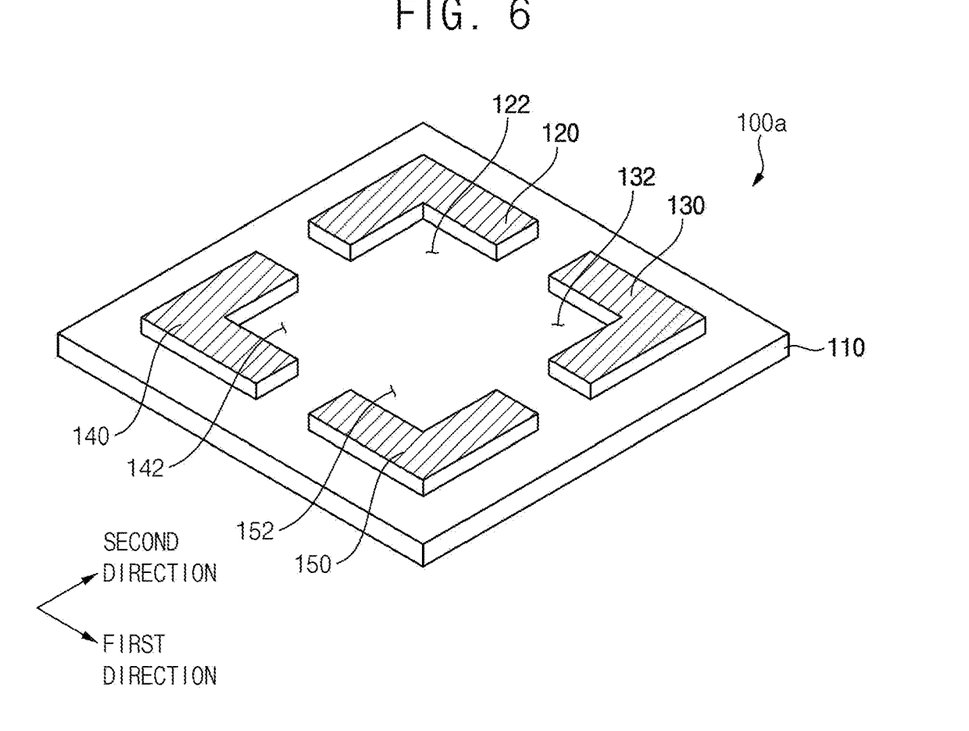
FIG. 6 is a perspective view illustrating a printed circuit board (PCB) in accordance with an exemplary embodiment of the present inventive concept.

FIG. 6 is a perspective view illustrating a PCB in accordance with an exemplary embodiment of the present inventive concept.

A PCB 100a of this exemplary embodiment may include elements substantially the same as those of the PCB 100 in FIG. 1 except for pads. Thus, the same reference numerals may refer to the same elements and any further illustrations with respect to the same element may be omitted herein for brevity.

Referring to FIG. 6, the PCB 100a of this exemplary embodiment may include a first pad 120, a second pad 130, a third pad 140 and a fourth pad 150, The first to fourth pads 120, 130, 140 and 150 may have a size and a shape substantially the same as the size and the shape of the first pad 120 and the second pad 130 in FIG. 1.

A passive element may be mounted on the first to fourth pads 120, 130, 140 and 150. The passive element may include two series resistances. For example, the passive element may include a first series resistance connected between the first pad 120 and the second pad 130, and a second series resistance connected between the third pad 140 and the fourth pad 150. Thus, the passive element may include an array register. The array register may include first and second electrodes arranged at both ends of the first series electrode, and third and fourth electrodes arranged at both ends of the second series electrode.

The first pad 120 and the second pad 130 may have arrangements substantially the same as those of the first and second pads 120 and 130 in FIG. 1. For example, the first pad 120 may be spaced apart from the second pad 130 along the first direction. The third pad 140 may be spaced apart from the first pad 120 along the second direction. The fourth pad 150 may be spaced apart from the third pad 140 along the first direction. In addition, the fourth pad 150 may be spaced apart from the second pad 130 along the second direction. Further, the first to fourth pads 120, 130, 140 and 150 may be arranged in the first and second directions by a substantially uniform gap. For example, when a distance between the first pad 120 and the second pad 140 may be about 0.2 mm, a distance between the first pad 120 and the third pad 140, a distance between the third pad 140 and the fourth pad 150, and a distance between the second pad 130 and the fourth pad 150 may be about 0.2 mm. Thus, the first to fourth pads 120, 130, 140 and 150 may have adjacent inner corners.

The first pad 120 may include a first recess 122. The first recess 122 may be formed at the inner corner of the first pad 120. The first recess 122 may be configured to receive the first electrode of the passive element. The first recess 122 may have a shape and a size substantially the same as the shape and the size of the first recess 122 in FIG. 1. Thus, the upper surface of the insulation substrate 110 may be exposed through the first recess 122.

The second pad 130 may include a second recess 132. The second recess 132 may be formed at the inner corner of the second pad 130. The second recess 132 may be configured to receive the second electrode of the passive element. The second recess 132 may have a shape and a size substantially the same as the shape and the size of the second recess 132 in FIG. 1. Thus, the upper surface of the insulation substrate 110 may be exposed through the second recess 132.

The third pad 140 may include a third recess 142. The third recess 142 may be formed at the inner corner of the third pad 140. The third recess 142 may be configured to receive the third electrode of the passive element. The third recess 142 may have a shape and a size substantially the same as the shape and the size of the first recess 122 in FIG. 1. Thus, the upper surface of the insulation substrate 110 may be exposed through the third recess 142.

The fourth pad 150 may include a fourth recess 152. The fourth recess 152 may be formed at the inner corner of the fourth pad 150. The fourth recess 152 may be configured to receive the fourth electrode of the passive element. The fourth recess 152 may have a shape and a size substantially the same as the shape and the size of the second recess 132 in FIG. 1. Thus, the upper surface of the insulation substrate 110 may be exposed through the fourth recess 152.

A rectangular parallelepiped space configured to receive the passive element may be formed between the first to fourth pads 120, 130, 140 and 150 by the first to fourth recesses 122, 132, 142 and 152.

Figure 7:
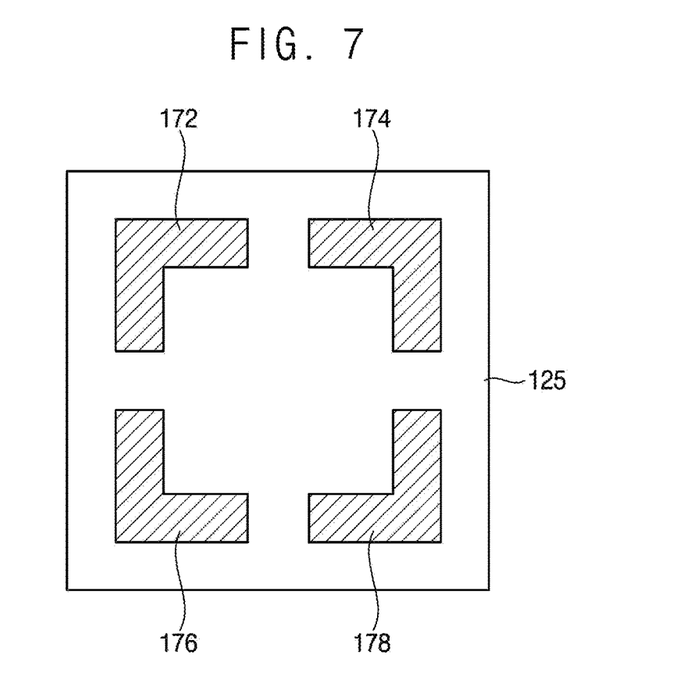
FIG. 7 is a plan view illustrating a method of manufacturing the PCB in FIG. 6.

FIG. 7 is a plan view illustrating a method of manufacturing the PCB in FIG. 6.

A method of manufacturing the PCB 100a in accordance with an exemplary embodiment of the present inventive concept may include processes substantially the same as those illustrated with reference to FIGS. 3 to 5 except for a shape of a mask pattern. Thus, any further illustrations with respect to the same processes may be omitted herein for brevity.

Referring to FIG. 7, an exposing process may be performed on a mask film 160 to form mask patterns 172, 174, 176 and 178. The mask patterns 172, 174, 176 and 178 may be configured to cover the first pad 120, the second pad 130, the third pad 140 and the fourth pad 150, respectively. For example, the mask patterns 172, 174, 176 and 178 may be used to form the first pad 120, the second pad 130, the third pad 140 and the fourth pad 150, respectively, in the conductive layer 125.

Figure 8:
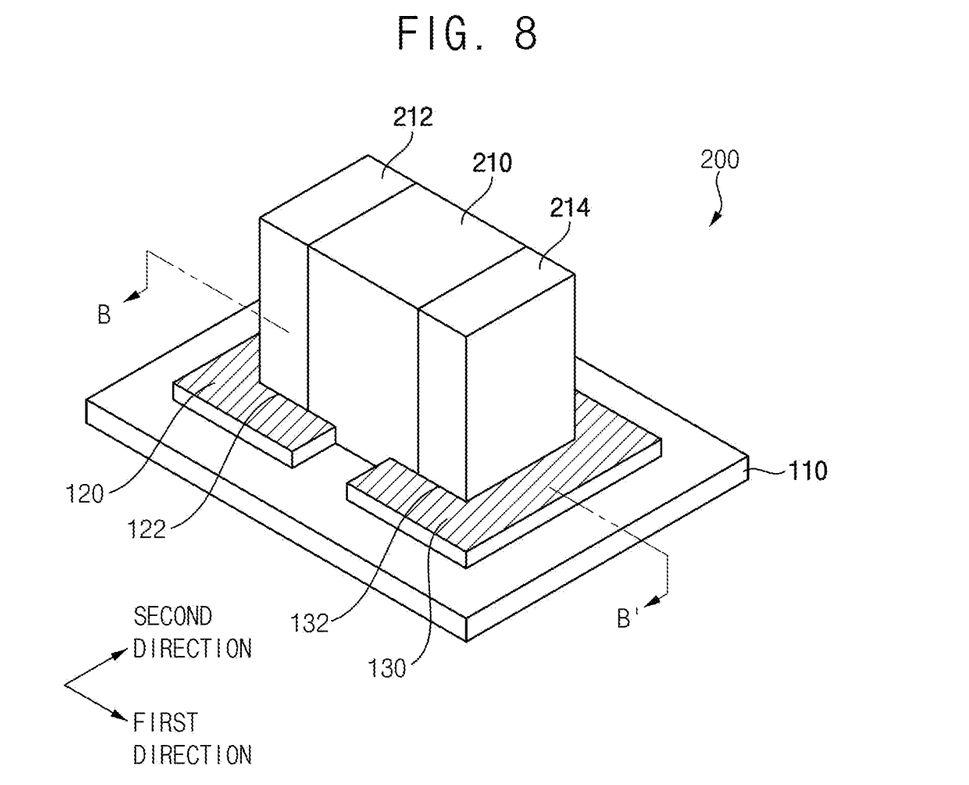
FIG. 8 is a perspective view illustrating a semiconductor module including the PCB in FIG. 1.
Figure 9:
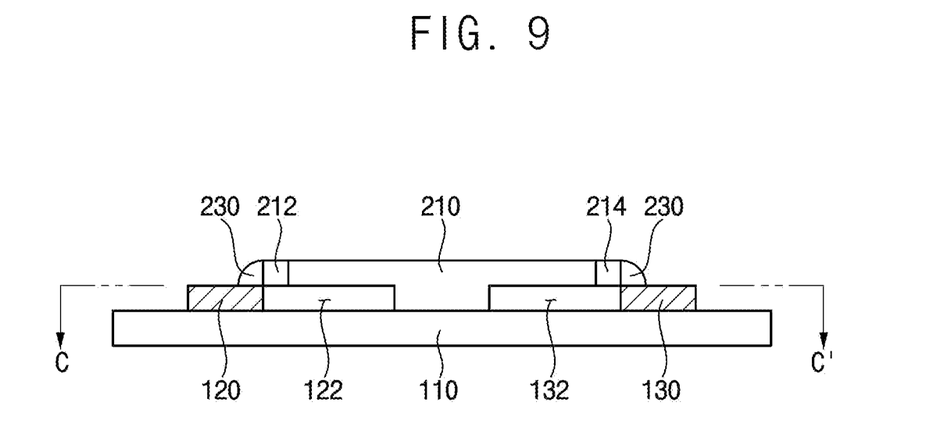
FIG. 9 is a cross-sectional view taken along a line B-B' in FIG. 8.
Figure 10:
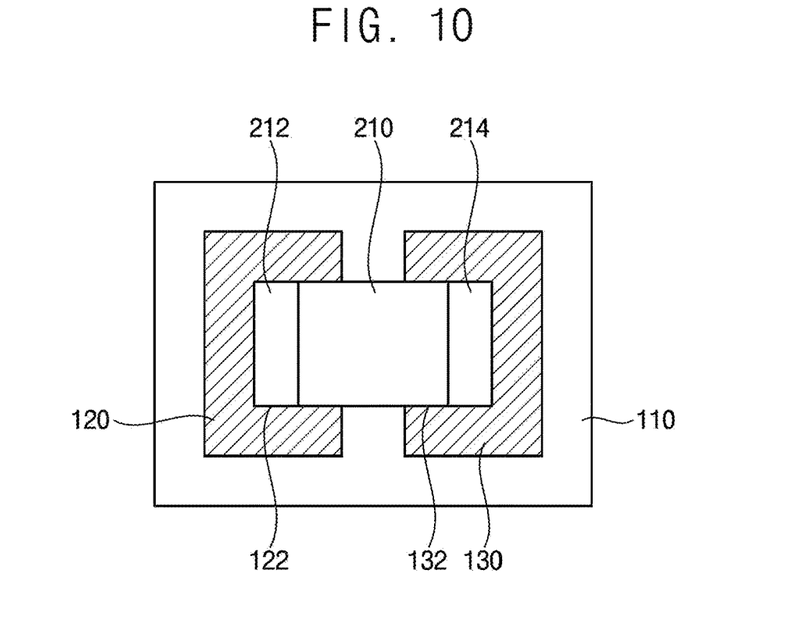
FIG. 10 is a cross-sectional view taken along a line C-C' in FIG. 9.

A conductive layer 125 may be etched using the mask patterns 172, 174, 176 and 178 as an etch mask to form the first pad 120, having the first recess 122, the second pad 130, having the second recess 132, the third pad 140, having the third recess and the fourth pad 150, having the fourth recess 152. The mask patterns 172, 174, 176 and 178 may then be removed to form the PCB 100a in FIG. 6, FIG. 8 is a perspective view illustrating a semiconductor module including the PCB in FIG. 1. FIG. 9 is a cross-sectional view taken along a line B-B' in FIG. 8, and FIG. 10 is a cross-sectional view taken along a line C-C' in FIG. 9. FIG. 8 may not show a solder layer in FIG. 9 to accurately depict a combination structure between a passive element and a PCB.

Referring to FIGS. 8 to 10, a semiconductor module 200 of this exemplary embodiment may include a PCB 100, a passive element 210 and a solder layer 230. The semiconductor module 200 may include, for example, a memory module, but the present inventive concept is not limited thereto.

The PCB 100 may have a structure substantially the same as that of the PCB 100 in FIG. 1. Thus, any further illustrations with respect to the PCB 100 may be omitted herein for brevity.

The passive element 210 may be mounted on the first and second pads 120 and 130 by a surface mount technology (SMT). The passive element 210 may include a first electrode 212, a second electrode 214 and a single series resistance connected between the first electrode 212 and the second electrode 214. For example, the passive element 210 may include a chip register. In addition, the passive element 210 may include a capacitor.

The passive element 210 may be received in the first recess 122 of the first pad 120 and the second recess 132 of the second pad 130. As mentioned above, because the upper surface of the insulation substrate 110 may be exposed through the first recess 122 and the second recess 132, the passive element 210 may have a lower surface configured to make contact with the exposed upper surface of the insulation substrate 110.

For example, the first electrode 212 may be inserted into the first recess 122. For example, the first electrode 212 may make contact with the inner surfaces of the first recess 122. For example, a gap may not be generated between the first electrode 212 and the inner surfaces of the first recess 122. For example, the first electrode 212 may contact the first pad 120, The second electrode 214 may be inserted into the second recess 132. For example, the second electrode 214 may make contact with the inner surfaces of the second recess 132. For example, a gap may not be generated between the second electrode 214 and the inner surfaces of the second recess 132. For example, the second electrode 214 may contact the second pad 130. Thus, the passive element 210 may be mounted on the first pad 120 and the second pad 130 by inserting the passive element 210 into the first and second recesses 122 and 132.

The solder layer 230 may be formed on the upper surfaces of the first and second pads 120 and 130 to at least partially surround side surfaces of the passive element 210. The solder layer 230 may be formed by forming a solder material on the upper surfaces of the first and second pads 120 and 130 using a stencil mask, which may have openings configured to expose the first and second pads 120 and 130, and performing a reflow process on the solder material, FIG. 11 is a perspective view illustrating a semiconductor module in accordance with an exemplary embodiment of the present inventive concept.

A semiconductor module 200a of this exemplary embodiment may include elements substantially the same as those of the semiconductor module 200 in FIG. 10 except for a solder layer. Thus, the same reference numerals may refer to the same elements and any further illustrations with respect to the same elements may be omitted herein for brevity.

Figure 11:
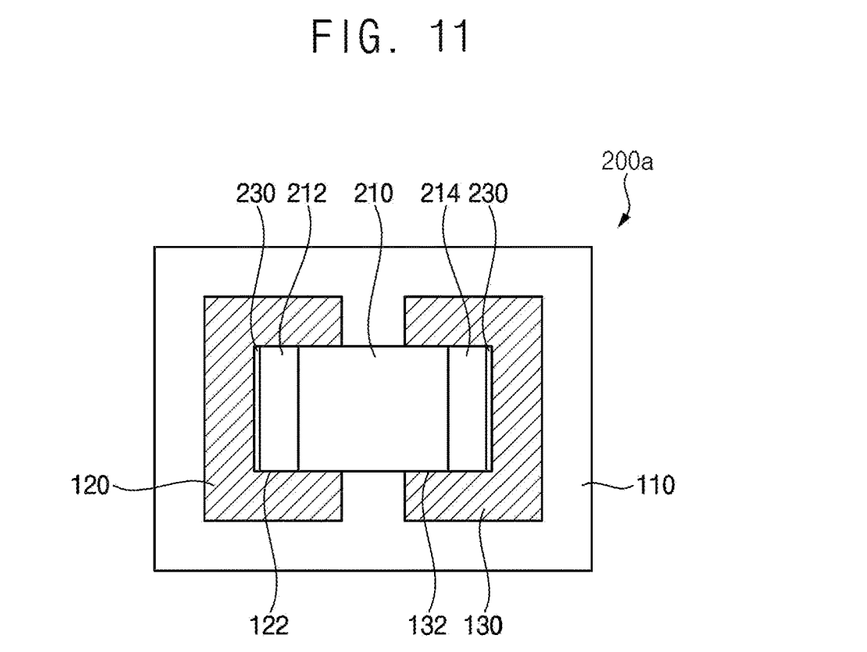
FIG. 11 is a perspective view illustrating a semiconductor module in accordance with an exemplary embodiment of the present inventive concept.

Referring to FIG. 11, a gap may be formed between a central inner surface among the inner surfaces of the first and second recesses 122 and 132 and ends of the first and second electrodes 212 and 214 of the passive element 210. For example, a gap may be formed between an end of the first electrode 212 and the central inner surface of the first recess 122, and a gap may be formed between an end of the second electrode 214 and the central inner surface of the second recess 132.

A stencil mask may have an opening configured to expose the gap. Thus, a solder material may be formed in the gap and on the upper surfaces of the first and second pads 120 and 130. When a reflow process may be performed on the solder material, the ends of the first and second electrodes 212 and 214 of the passive element 210 may be connected to the first and second pads 120 and 130, respectively, via the solder layer 230.

Figure 12:
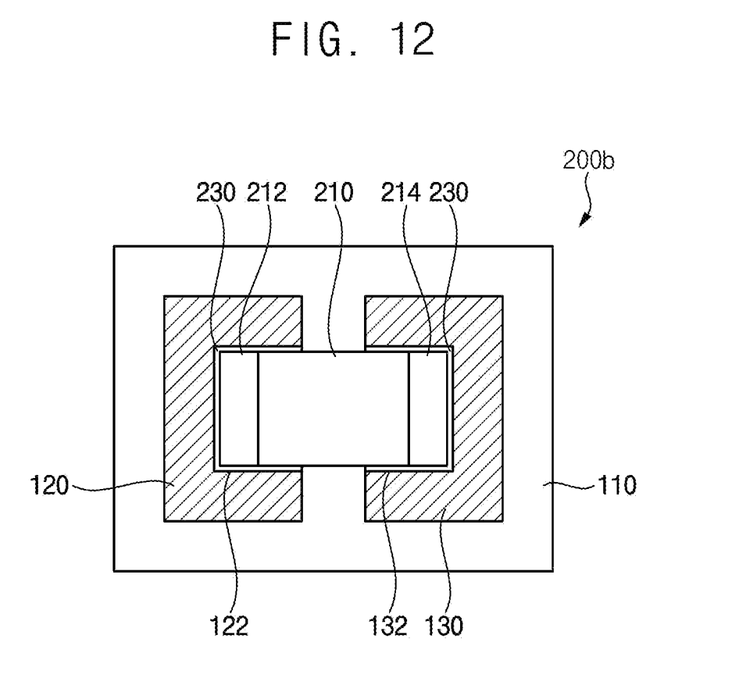
FIG. 12 is a perspective view illustrating a semiconductor module in accordance with an exemplary embodiment of the present inventive concept.

FIG. 12 is a perspective view illustrating a semiconductor module in accordance with an exemplary embodiment of the present inventive concept.

A semiconductor module 200b of this exemplary embodiment may include elements substantially the same as those of the semiconductor module 200 in FIG. 10 except for a solder layer. Thus, the same reference numerals may refer to the same elements and any further illustrations with respect to the same elements may be omitted herein for brevity.

Referring to FIG. 12, gaps may be formed between the inner surfaces of the first and second recesses 122 and 132 and ends and side surfaces of the first and second electrodes 212 and 214 of the passive element 210. For example, a gap may be formed between an end and side surfaces of the first electrode 212 and the inner surfaces of the first recess 122, and a gap may be formed between an end and side surfaces of the second electrode 214 and the inner surfaces of the second recess 132.

A stencil mask may have openings configured to expose the gaps. Thus, a solder material may be formed in the gaps and on the upper surfaces of the first and second pads 120 and 130. When a reflow process may be performed on the solder material, the ends and the side surfaces of the first and second electrodes 212 and 214 of the passive element 210 may be connected to the first and second pads 120 and 130, respectively, via the solder layer 230.

Figure 13:
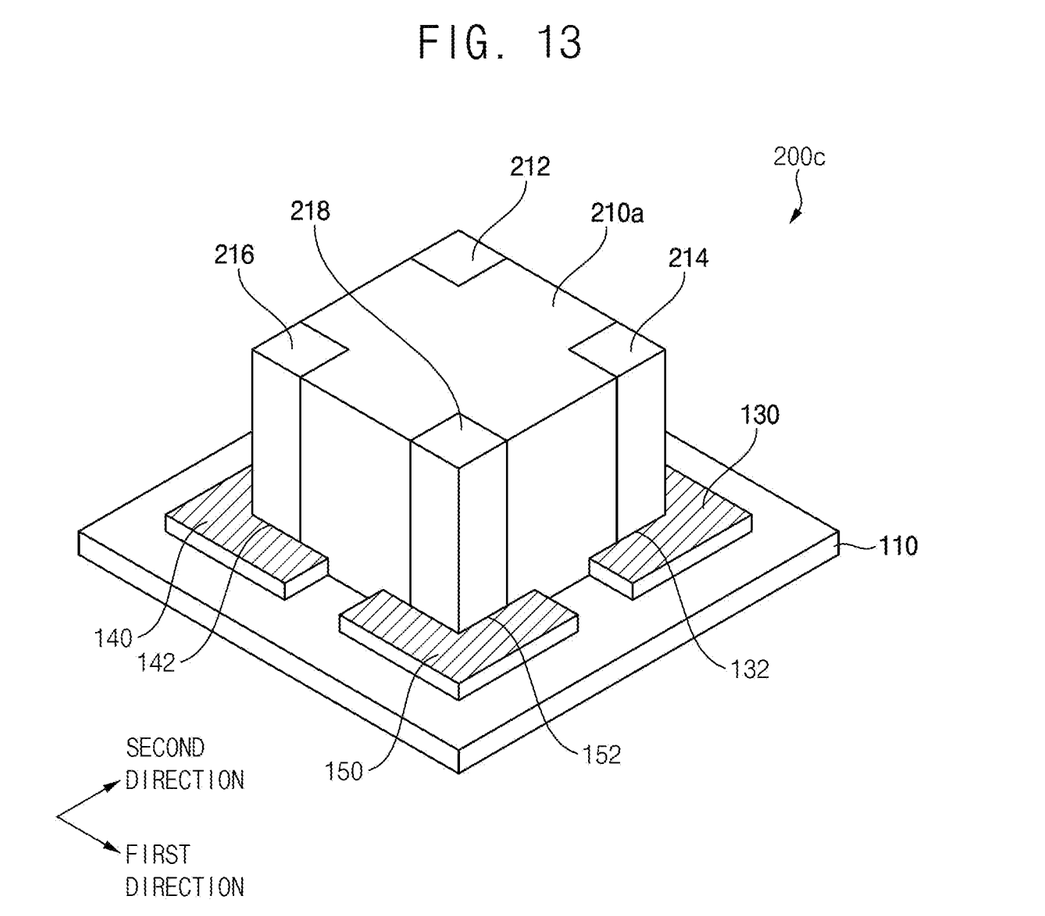
FIG. 13 is a perspective view illustrating a semiconductor module including the PCB in FIG. 6.
Figure 14:
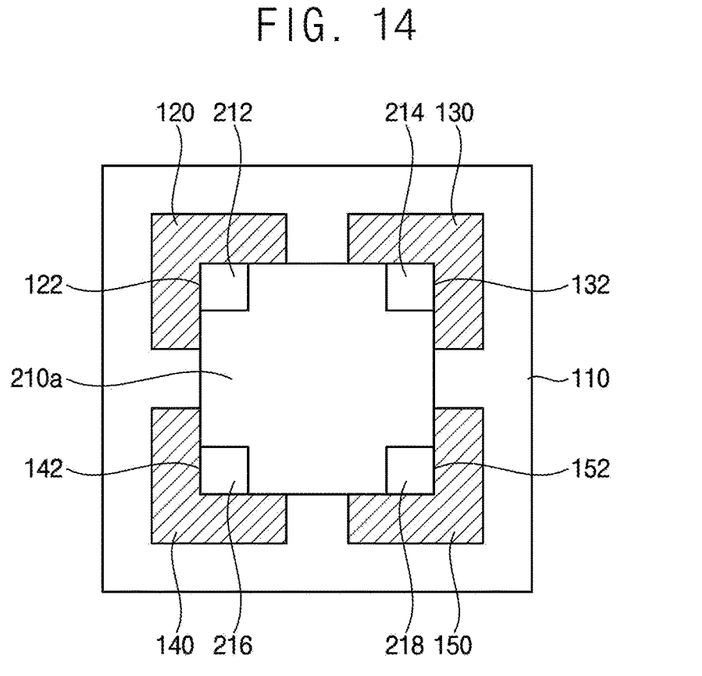
FIG. 14 is a cross-sectional view illustrating the semiconductor module in FIG. 13.

FIG. 13 is a perspective view illustrating a semiconductor module including the PCB in FIG. 6, and FIG. 14 is a cross-sectional view illustrating the semiconductor module in FIG. 13.

Referring to FIGS. 13 and 14, a semiconductor module 200c of this exemplary embodiment may include a PCB 100a, a passive element 210a and a solder layer 230.

The PCB 100a may have a structure substantially the same as that of the PCB 100a in FIG. 6. Thus, any further illustrations with respect to the PCB 100a may be omitted herein for brevity.

The passive element 210a may be mounted on the first to fourth pads 120 and 130 by a surface mount technology (SMT). The passive element 210a may include a first electrode 212, a second electrode 214, and a first single series resistance connected between the first electrode 212 and the second electrode 214. The passive element 210a may further include a third electrode 216, a fourth electrode 218 and a second single series resistance connected between the third electrode 216 and the fourth electrode 218. For example, the passive element 210a may include an array register. The passive element 210a may be received in the first recess 122 of the first pad 120, the second recess 132 of the second pad 130, the third recess 142 of the third pad 140 and the fourth recess 152 of the fourth pad 150. As mentioned above, because the upper surface of the insulation substrate 110 may be exposed through the first to fourth recesses 122, 132, 142 and 152, the passive element 210a may have a lower surface configured to make contact with the exposed upper surface of the insulation substrate 110.

For example, the first electrode 212 may be inserted into the first recess 122. The first electrode 212 may make contact with the inner surfaces of the first recess 122. For example, a gap may not be generated between the first electrode 212 and the inner surfaces of the first recess 122. The second electrode 214 may be inserted into the second recess 132. The second electrode 214 may make contact with the inner surfaces of the second recess 132. For example, a gap may not be generated between the second electrode 214 and the inner surfaces of the second recess 132. The third electrode 216 may be inserted into the third recess 142. The third electrode 216 may make contact with the inner surfaces of the third recess 142. For example, a gap may not be generated between the third electrode 216 and the inner surfaces of the third recess 142. The fourth electrode 218 may be inserted into the fourth recess 152. The fourth electrode 218 may make contact with the inner surfaces of the fourth recess 152. For example, a gap may not be generated between the fourth electrode 218 and the inner surfaces of the fourth recess 152. Thus, the passive element 210a may be mounted on the first to fourth pads 120, 130, 140 and 150 by inserting the passive element 210a into the first to fourth recesses 122, 132, 142 and 152.

The solder layer 230 may be formed on the upper surfaces of the first to fourth pads 120, 130, 140 and 150 to at least partially surround side surfaces of the passive element 210a, The solder layer 230 may be formed by forming a solder material on the upper surfaces of the first to fourth pads 120, 130, 140 and 150 using a stencil mask, which may have openings configured to expose the first to fourth pads 120, 130, 140 and 150, and performing a reflow process on the solder material.

Figure 15:
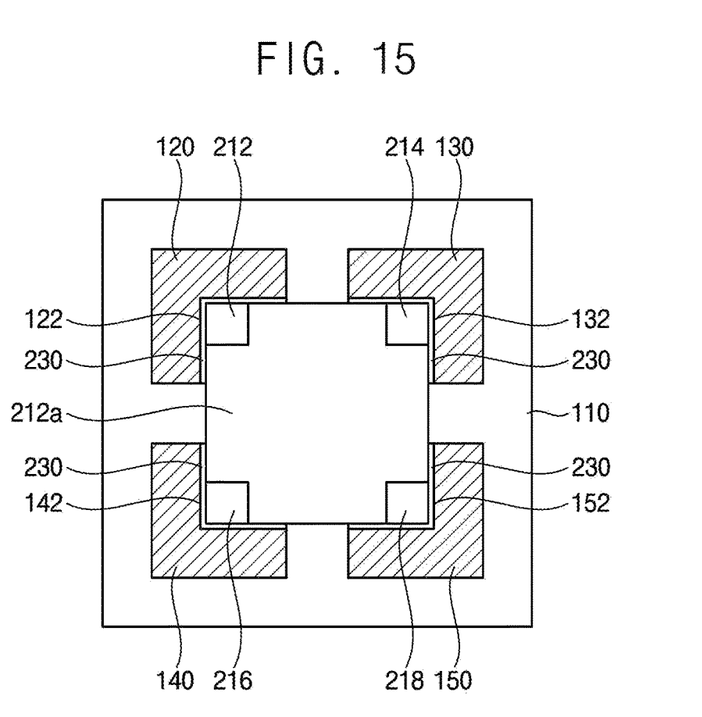
FIG. 15 is a cross-sectional view illustrating a semiconductor module in accordance with an exemplary embodiment of the present inventive concept.

FIG. 15 is a cross-sectional view illustrating a semiconductor module in accordance with an exemplary embodiment of the present inventive concept.

A semiconductor module 200d of this exemplary embodiment may include elements substantially the same as those of the semiconductor module 200c in FIG. 14 except for a solder layer. Thus, the same reference numerals may refer to the same elements and any further illustrations with respect to the same elements may be omitted herein for brevity.

Referring to FIG. 15, gaps may be formed between the inner surfaces of the first to fourth recesses 122, 132, 142 and 152 and ends and side surfaces of the first to fourth electrodes 212, 214, 216 and 218 of the passive element 210. For example, a gap may be formed between an end and side surfaces of the first electrode 212 and the inner surfaces of the first recess 122, and a gap may be formed between an end and side surfaces of the second electrode 214 and the inner surfaces of the second recess 132, As an additional example, a gap may be formed between an end and side surfaces of the third electrode 216 and the inner surfaces of the third recess 142, and a gap may be formed between an end and side surfaces of the fourth electrode 218 and the inner surfaces of the fourth recess 152.

A stencil mask may have openings configured to expose the gaps. Thus, a solder material may be formed in the gaps and on the upper surfaces of the first to fourth pads 120, 130, 140 and 150. When a reflow process may be performed on the solder material, the ends and the side surfaces of the first to fourth electrodes 212, 214, 216 and 218 of the passive element 210 may be connected to the first to fourth pads 120, 130, 140 and 150, respectively, via the solder layer 230.

Comparing Displacements by a Same Load to Semiconductor Modules including a Chip register.

A same load was applied to a conventional semiconductor module, which does not include a recess, and the semiconductor module in FIG. 8 to measure displacements of the semiconductor modules.

| Load apply direction | Conventional semiconductor module | Semiconductor module with recess | Improvement ratio of displacements |
| --- | --- | --- | --- |
| First direction | 70 μm | 31 μm | 56% |
| Second direction | 15.7 μm | 10.4 μm | 34% |

As shown in the above Table, when the load was applied along the first direction, the displacement of the semiconductor module in FIG. 8 was reduced by about 56% compared to the conventional semiconductor module. When the load was applied along the second direction, the displacement of the semiconductor module in FIG. 8 was reduced by about 34% compared to the conventional semiconductor module. Thus, when the chip register was inserted into the recess of the pad, it can be noted that an adhesion force between the chip register and the pad was reinforced.

Comparing Displacements by a Same Load to Semiconductor Modules including an Array register,

| Load apply direction | Conventional semiconductor module | Semiconductor module with recess | Improvement ratio of displacements |
| --- | --- | --- | --- |
| First direction | 39.5 μm | 28.3 μm | 28% |
| Second direction | 92.2 μm | 73.6 μm | 20% |

As shown in the above Table, when the load was applied along the first direction, the displacement of the semiconductor module in FIG. 8 was reduced by about 28% compared to the conventional semiconductor module. When the load was applied along the second direction, the displacement of the semiconductor module in FIG. 8 was reduced by about 20% compared to the conventional semiconductor module, Thus, when the array register was inserted into the recess of the pad, it can be noted that an adhesion force between the array register and the pad was reinforced.

According to exemplary embodiments of the present inventive concept, the passive element may be inserted into the recess of the pads so that the passive element may be combined with the pads. Thus, the passive element may be firmly bonded to the pads by a reflow process using a solder.

While the present inventive concept has been described with reference to exemplary embodiments thereof, it will be understood by those of ordinary skill in the art that various changes in form and details may be made thereto without departing from the spirit and scope of the present inventive concept.

What is claimed is:
1. A primed circuit board (PCB) comprising:
an insulation substrate;
a first pad arranged on the insulation substrate;
a second pad arranged on the insulation substrate and spaced apart from the first pad along a first direction, wherein the second pad has a size substantially the same as a size of the first pad;
a third pad arranged on the insulation substrate and spaced apart from the first pad along a second direction that is substantially perpendicular to the first direction;
a fourth pad arranged on the insulation substrate and spaced apart from the third pad along the first direction, wherein the fourth pad is spaced apart from the second pad along the second direction,
wherein the first pad includes a first recess having a rectangular shape configured to receive a first electrode of a passive element, wherein the second pad includes a second recess receiving a second electrode of the passive element, wherein the first recess has a depth substantially the same as a thickness of the first pad, wherein the second recess has a depth substantially the same as a thickness of the second pad, wherein each of the first recess and the second recess exposes an upper surface of the insulation substrate, wherein each of the first and second recesses has a first length along the first direction of about 0.29 times to about 0.86 times a first length of the first pad along the first direction, and wherein each of the first and second recesses has a second length along the second direction, which is substantially perpendicular to the first direction, of about 0.4 times to about 0.8 times a second length of the first pad along the second direction, wherein the first through fourth pads are arranged in the first and second directions by a substantially uniform gap.

2. The PCB of claim 1, wherein the first recess is formed at a central portion of an inner surface of the first pad oriented toward the second pad, and the second recess is formed at a central portion of an inner surface of the second pad oriented toward the first pad.

3. The PCB of claim 2, wherein the first length of the first pad is about 0.35 mm, the second length of the first pad is about 0.5 mm, and a distance between the first pad and the second pad is about 0.2 mm.

4. The PCB of claim 3, wherein the first length of each of the first and second recesses is about 0.1 mm to about 0.3 mm, and the second length of each of the first and second recesses is about 0.2 mm to about 0.4 mm.

5. The PCB of claim 1,
wherein the third pad has a size substantially the same as the size of the first pad,
wherein the fourth pad has a size substantially the same as the size of the first pad,
wherein the third pad includes a third recess having a shape substantially the same as the shape of the first recess and receiving a third electrode of the passive element, wherein the fourth pad includes a fourth recess having a shape substantially the same as the shape of the first pad and receiving a fourth electrode of the passive element, wherein the third recess has a depth substantially the same as a thickness of the third pad, wherein the fourth recess has a depth substantially the same as a thickness of the fourth pad, and wherein each of the third recess and the fourth recess exposes the upper surface of the insulation substrate.

6. The PCB of claim 5, wherein the first to fourth recesses are respectively formed at adjacent corners of the first to fourth pads.

7. A printed circuit board (PCB) comprising:
an insulation substrate;
a first pad arranged on an upper surface of the insulation substrate;
a second pad arranged on the upper surface of the insulation substrate and spaced apart from the first pad along a first direction;
a third pad arranged on the insulation substrate and spaced apart from the first pad along a second direction that is substantially perpendicular to the first direction; and
a fourth pad arranged on the insulation substrate and spaced apart from the third pad along the first direction, wherein the fourth pad is spaced apart from the second pad along the second direction,
wherein the first pad includes a first recess configured to receive a first electrode of a passive element, wherein the second pad includes a second recess configured to receive a second electrode of the passive element, wherein the first recess has a depth substantially the same as a thickness of the first pad, wherein the second recess has a depth substantially the same as a thickness of the second pad, and wherein each of the first recess and the second recess exposes the upper surface of the insulation substrate, wherein the first through fourth pads are arranged in the first and second directions by a substantially uniform gap.

8. The PCB of claim 7, wherein the first recess is formed at a central portion of an inner surface of the first pad oriented toward the second pad, and the second recess is formed at a central portion of an inner surface of the second pad oriented toward the first pad.

9. The PCB of claim 8, wherein the first recess has a shape substantially the same as a shape of the second recess.

10. The PCB of claim 9, wherein the first and second recesses have a rectangular shape.

11. The PCB of claim 7, wherein the first pad has a shape substantially the same as a shape of the second pad.

12. The PCB of claim 7,
wherein the third pad is arranged on the upper surface of the insulation substrate,
wherein the fourth pad is arranged on the upper surface of the insulation substrate,
wherein the third pad includes a third recess configured to receive a third electrode of the passive element, wherein the fourth pad includes a fourth recess configured to receive a fourth electrode of the passive element, wherein the third recess has a depth substantially the same as a thickness of the third pad, wherein the fourth recess has a depth substantially the same as a thickness of the fourth pad, and wherein each of the third recess and the fourth recess exposes the upper surface of the insulation substrate.

13. The PCB of claim 12, wherein the first to fourth recesses are respectively formed at adjacent corners of the first to fourth pads.

14. The PCB of claim 13, wherein the first to fourth recesses have substantially the same shape as one another.

15. The PCB of claim 13, wherein the first to fourth pads have substantially the same shape as one another.

16. A semiconductor module comprising:
a printed circuit board (PCB) including:
an insulation substrate;
a first pad arranged on an upper surface of the insulation substrate, wherein the first pad includes a first recess configured to expose the upper surface of the insulation substrate; and
a second pad arranged on the upper surface of the insulation substrate and spaced apart from the first pad along a first direction, wherein the second pad includes a second recess configured to expose the upper surface of the insulation substrate;
a passive element mounted on the first pad and the second pad, wherein the passive element is inserted into the first and second recesses; and
a solder layer formed on the first and second pads to at least partially surround side surfaces of the passive element,
wherein solder layer extends along the first recess and the second recess and does not extend into the first and second recesses.

17. The semiconductor module of claim 16, wherein the passive element comprises a first electrode inserted into the first recess, and a second electrode inserted into the second recess.

18. The semiconductor module of claim 16, wherein the PCB further comprises:
a third pad arranged on the upper surface of the insulation substrate and spaced apart from the first pad along a second direction substantially perpendicular to the first direction, wherein the third pad includes a third recess configured to expose the upper surface of the insulation substrate; and a fourth pad arranged on the upper surface of the insulation substrate and spaced apart from the third pad along the first direction, wherein the fourth pad includes a fourth recess configured to expose the upper surface of the insulation substrate.

19. The semiconductor module of claim 18, wherein the passive element comprises a first electrode inserted into the first recess, a second electrode inserted into the second recess, a third electrode inserted into the third recess, and a fourth electrode inserted into the fourth recess.

20. The semiconductor module of claim 16, wherein the solder layer is coplanar with an inner side surface of the first pad and an inner side surface of the second pad.

* * * * *